United States Patent
Dwilinski et al.

(10) Patent No.: US 7,589,358 B2
(45) Date of Patent: Sep. 15, 2009

(54) PHOSPHOR SINGLE CRYSTAL SUBSTRATE AND METHOD FOR PREPARING THE SAME, AND NITRIDE SEMICONDUCTOR COMPONENT USING THE SAME

(75) Inventors: Robert Dwilinski, Warsaw (PL);
Roman Doradzinski, Warsaw (PL);
Jerzy Garczynski, Lomianki (PL);
Leszek Sierzputowski, Union, NJ (US);
Yasuo Kanbara, Anan (JP)

(73) Assignees: AMMONO Sp. z o.o., Warsaw (PL);
Nichia Corporation, Anan-shi (JP)

( * ) Notice: Subject to any disclaimer, the term of this patent is extended or adjusted under 35 U.S.C. 154(b) by 480 days.

(21) Appl. No.: 10/514,429

(22) PCT Filed: Dec. 13, 2002

(86) PCT No.: PCT/JP02/13079
§ 371 (c)(1),
(2), (4) Date: Jul. 12, 2005

(87) PCT Pub. No.: WO03/098708
PCT Pub. Date: Nov. 27, 2003

(65) Prior Publication Data
US 2006/0054076 A1 Mar. 16, 2006

(51) Int. Cl.
*H01L 33/00* (2006.01)
*C30B 15/14* (2006.01)

(52) U.S. Cl. .................. 257/102; 257/103; 257/615; 257/E33.025; 257/E33.03; 252/301.4 R

(58) Field of Classification Search .......... 117/3, 117/70, 73, 68, 69, 953, 952, 200, 205, 206; 257/E33.028, E33.061, 615, 102, 103, E33.025, 257/E33.03; 250/493.1, 483.1; 422/245.1; 428/698, 697, 220; 423/409, 412; 252/62.3 GA, 252/301.4 R, 301.4 F
See application file for complete search history.

(56) References Cited

U.S. PATENT DOCUMENTS 5,096,860 A    3/1992   Nadkarni (Continued)

FOREIGN PATENT DOCUMENTS

CN    1036414    10/1989

(Continued)

OTHER PUBLICATIONS

Mao et al. "New concept technology pressure variation liquid phase epitaxy", SPIE Photonics Taiwan Conference Proceeding Jul. 2000, p. 1-12.*

(Continued)

*Primary Examiner*—David A Vanore
*Assistant Examiner*—Michael J Logie
(74) *Attorney, Agent, or Firm*—Morrison & Foerster LLP

(57) ABSTRACT

A light emitting device having a phosphor substrate, which comprises nitride containing at least one element selected from Group XIII (IUPAC 1989) having a general formula XN, wherein X is at least one element selected from B, Al, Ga and In, a general formula XN:Y, wherein X is at least one element selected from B, Al, Ga and In, and Y is at least one element selected from Be, Mg, Ca, Sr, Ba, Zn, Cd and Hg, or a general formula XN:Y,Z, wherein X is at least one element selected from B, Al, Ga and In, Y is at least one element selected from Be, Mg, Ca, Sr, Ba, Zn, Cd and Hg, and Z is at least one element selected from C, Si, Ge, Sn, Pb, O and S. The phosphor substrate is prepared by crystallization from supercritical ammonia-containing solution and the light emitting device is formed by a vapor phase growth on the phosphor substrate so as to obtain a light emitting device which has a wavelength distribution emitting a white light etc. and a good yield.

18 Claims, 8 Drawing Sheets

U.S. PATENT DOCUMENTS

| | | | |
|---|---|---|---|
| 5,147,623 A * | 9/1992 | Eun et al. | 423/290 |
| 5,190,738 A * | 3/1993 | Parent | 423/412 |
| 5,306,662 A | 4/1994 | Nakamura et al. | |
| 5,456,204 A | 10/1995 | Dimitrov et al. | |
| 5,589,153 A | 12/1996 | Garces | |
| 5,679,965 A | 10/1997 | Schetzina | |
| 5,780,876 A | 7/1998 | Hata | |
| 5,868,837 A * | 2/1999 | DiSalvo et al. | 117/2 |
| 5,928,421 A * | 7/1999 | Yuri et al. | 117/97 |
| 6,031,858 A | 2/2000 | Hatakoshi et al. | |
| 6,046,464 A | 4/2000 | Schetzina | |
| 6,051,145 A * | 4/2000 | Griffith et al. | 210/761 |
| 6,067,310 A | 5/2000 | Hashimoto et al. | |
| 6,139,628 A | 10/2000 | Yuri et al. | |
| 6,156,581 A * | 12/2000 | Vaudo et al. | 438/22 |
| 6,172,382 B1 | 1/2001 | Nagahama | |
| 6,177,057 B1 * | 1/2001 | Purdy | 423/409 |
| 6,177,292 B1 | 1/2001 | Hong et al. | |
| 6,248,607 B1 | 6/2001 | Tsutsui | |
| 6,249,534 B1 * | 6/2001 | Itoh et al. | 372/49.01 |
| 6,252,261 B1 | 6/2001 | Usui | |
| 6,258,617 B1 * | 7/2001 | Nitta et al. | 438/46 |
| 6,265,322 B1 * | 7/2001 | Anselm et al. | 438/745 |
| 6,270,569 B1 * | 8/2001 | Shibata et al. | 117/68 |
| 6,303,403 B1 * | 10/2001 | Sato et al. | 438/29 |
| 6,329,215 B1 | 12/2001 | Porowski et al. | |
| 6,355,497 B1 | 3/2002 | Romano et al. | |
| 6,372,041 B1 * | 4/2002 | Cho et al. | 117/84 |
| 6,399,500 B1 | 6/2002 | Porowski et al. | |
| 6,399,966 B1 | 6/2002 | Tsuda | |
| 6,423,984 B1 | 7/2002 | Kato | |
| 6,447,604 B1 | 9/2002 | Flynn et al. | |
| 6,459,712 B2 | 10/2002 | Tanaka et al. | |
| 6,468,882 B2 | 10/2002 | Motoki | |
| 6,475,277 B1 | 11/2002 | Hirota et al. | |
| 6,488,767 B1 | 12/2002 | Xu et al. | |
| 6,509,651 B1 | 1/2003 | Matsubara | |
| 6,531,072 B1 * | 3/2003 | Suda et al. | 252/301.4 R |
| 6,534,795 B2 * | 3/2003 | Hori et al. | 257/79 |
| 6,586,762 B2 | 7/2003 | Kozaki | |
| 6,592,663 B1 * | 7/2003 | Sarayama et al. | 117/68 |
| 6,593,589 B1 | 7/2003 | Osinski et al. | |
| 6,614,824 B2 | 9/2003 | Tsuda | |
| 6,627,552 B1 | 9/2003 | Nishio et al. | |
| 6,639,925 B2 | 10/2003 | Niwa et al. | |
| 6,653,663 B2 | 11/2003 | Ishida | |
| 6,656,615 B2 * | 12/2003 | Dwilinski et al. | 428/698 |
| 6,677,619 B1 | 1/2004 | Nagahama | |
| 6,686,608 B1 | 2/2004 | Takahira | |
| 6,693,935 B2 | 2/2004 | Tojo et al. | |
| 6,711,191 B1 | 3/2004 | Kozaki | |
| 6,720,586 B1 * | 4/2004 | Kidoguchi et al. | 257/103 |
| 6,749,819 B2 | 6/2004 | Otsuka et al. | |
| 6,858,882 B2 | 2/2005 | Tsuda | |
| 6,924,512 B2 | 8/2005 | Tsuda | |
| 7,053,413 B2 * | 5/2006 | D'Evelyn et al. | 257/79 |
| 7,057,211 B2 | 6/2006 | Dwilinski et al. | |
| 7,081,162 B2 | 7/2006 | Dwilinski et al. | |
| 7,097,707 B2 * | 8/2006 | Xu | 117/13 |
| 7,132,730 B2 * | 11/2006 | Dwilinski et al. | 257/615 |
| 7,160,388 B2 * | 1/2007 | Dwilinski et al. | 117/68 |
| 7,252,712 B2 | 8/2007 | Dwilinski et al. | |
| 7,291,544 B2 * | 11/2007 | D'Evelyn et al. | 438/478 |
| 7,314,517 B2 | 1/2008 | Dwilinski et al. | |
| 7,335,262 B2 | 2/2008 | Dwilinski et al. | |
| 7,364,619 B2 | 4/2008 | Dwilinski et al. | |
| 7,374,615 B2 | 5/2008 | Dwilinski et al. | |
| 7,387,677 B2 | 6/2008 | Dwilinski et al. | |
| 7,420,261 B2 * | 9/2008 | Dwilinski et al. | 257/615 |
| 7,422,633 B2 | 9/2008 | Dwilinski et al. | |
| 2001/0008656 A1 * | 7/2001 | Tischler et al. | 428/34.1 |
| 2001/0022154 A1 * | 9/2001 | Cho et al. | 117/2 |
| 2001/0030328 A1 | 10/2001 | Ishida | |
| 2002/0014631 A1 | 2/2002 | Iwata | |
| 2002/0028564 A1 * | 3/2002 | Motoki et al. | 438/460 |
| 2002/0031153 A1 | 3/2002 | Niwa | |
| 2002/0047113 A1 | 4/2002 | Ohno | |
| 2002/0063258 A1 * | 5/2002 | Motoki | 257/95 |
| 2002/0078881 A1 | 6/2002 | Cuomo | |
| 2002/0189531 A1 | 12/2002 | Dwilinski et al. | |
| 2002/0192507 A1 | 12/2002 | Dwilinski et al. | |
| 2003/0001238 A1 * | 1/2003 | Ban | 257/627 |
| 2003/0003770 A1 * | 1/2003 | Morita et al. | 438/778 |
| 2003/0022028 A1 * | 1/2003 | Koike et al. | 428/698 |
| 2003/0143771 A1 | 7/2003 | Kidoguchi et al. | |
| 2003/0209191 A1 * | 11/2003 | Purdy | 117/84 |
| 2004/0003495 A1 * | 1/2004 | Xu | 29/832 |
| 2004/0031978 A1 * | 2/2004 | D'Evelyn et al. | 257/233 |
| 2004/0089221 A1 | 5/2004 | Dwilinski et al. | |
| 2004/0139912 A1 | 7/2004 | Tomasz Dwilinski | |
| 2004/0238810 A1 | 12/2004 | Dwilinski et al. | |
| 2004/0244680 A1 | 12/2004 | Dwilinski et al. | |
| 2004/0251471 A1 | 12/2004 | Dwilinski et al. | |
| 2004/0255840 A1 | 12/2004 | Dwilinski et al. | |
| 2004/0261692 A1 | 12/2004 | Dwilinski et al. | |
| 2005/0087124 A1 | 4/2005 | Dwilinski et al. | |
| 2005/0249255 A1 | 11/2005 | Dwilinski et al. | |
| 2006/0032428 A1 | 2/2006 | Dwilinski et al. | |
| 2006/0037530 A1 | 2/2006 | Dwilinski et al. | |
| 2006/0054075 A1 | 3/2006 | Dwilinski et al. | |
| 2006/0054076 A1 | 3/2006 | Dwilinski et al. | |
| 2006/0057749 A1 | 3/2006 | Dwilinski et al. | |
| 2006/0124051 A1 | 6/2006 | Yoshioka et al. | |
| 2006/0138431 A1 | 6/2006 | Dwilinski et al. | |
| 2008/0050855 A1 | 2/2008 | Dwilinski et al. | |
| 2008/0108162 A1 | 5/2008 | Dwilinski et al. | |
| 2008/0156254 A1 | 7/2008 | Dwilinski et al. | |

FOREIGN PATENT DOCUMENTS

| | | |
|---|---|---|
| CN | 1065289 C | 10/1992 |
| CN | 1289867 A | 4/2001 |
| CN | 1260409 | 6/2006 |
| EP | 0711853 B1 | 5/1996 |
| EP | 0716457 A2 | 6/1996 |
| EP | 0711853 B1 * | 9/1999 |
| EP | 0 949 731 | 10/1999 |
| EP | 0973207 A2 | 1/2000 |
| EP | 1088914 A1 * | 4/2001 |
| EP | 1088914 A1 | 4/2001 |
| EP | 1 164 210 A2 | 12/2001 |
| EP | 1 405 936 A1 | 4/2004 |
| EP | 1 616 981 A1 | 1/2006 |
| FR | 2796657 A1 | 1/2001 |
| FR | 2796657 A1 * | 1/2001 |
| GB | 2326160 A | 12/1998 |
| GB | 2333521 A | 7/1999 |
| JP | 51-41686 | 4/1976 |
| JP | 02-137287 | 5/1990 |
| JP | 5-183189 | 7/1993 |
| JP | 07-022692 B2 | 3/1995 |
| JP | 7-165498 | 6/1995 |
| JP | 7-249830 | 9/1995 |
| JP | 8-250802 | 9/1996 |
| JP | 9-134878 | 5/1997 |
| JP | 9-508093 | 8/1997 |
| JP | 09-293897 | 11/1997 |
| JP | 10-7496 | 1/1998 |
| JP | 10-70079 A | 3/1998 |
| JP | 10-70338 | 3/1998 |
| JP | 10-84161 A | 3/1998 |
| JP | 410070079 A * | 3/1998 |
| JP | 11-54847 | 2/1999 |

| | | |
|---|---|---|
| JP | 11-307813 | 11/1999 |
| JP | 2000-82863 | 3/2000 |
| JP | 2000-82867 A | 3/2000 |
| JP | 2000-216494 | 8/2000 |
| JP | 2000-327495 | 11/2000 |
| JP | 2001-077038 | 3/2001 |
| JP | 2001-85737 | 3/2001 |
| JP | 2001-342100 | 12/2001 |
| JP | 2002-026442 | 1/2002 |
| JP | 2002241112 A * | 8/2002 |
| JP | 2002274997 A * | 9/2002 |
| JP | 2003040699 A | 2/2003 |
| JP | 2004168656 A | 6/2004 |
| PL | 347918 | 12/2002 |
| PL | 350375 | 5/2003 |
| WO | WO 94/28204 | 12/1994 |
| WO | WO 97/13891 | 4/1997 |
| WO | WO-98-55671 | 12/1998 |
| WO | WO-01-24284 A1 | 4/2001 |
| WO | WO 01/24284 A1 * | 4/2001 |
| WO | WO 01/24921 A1 * | 4/2001 |
| WO | WO-01-24921 A1 | 4/2001 |
| WO | WO-02/101124 A1 | 12/2002 |
| WO | WO-02101120 A2 | 12/2002 |
| WO | WO-03/035945 | 5/2003 |
| WO | WO-2004/090202 A1 | 10/2004 |

OTHER PUBLICATIONS

Ketchum et al. "Crystal growth of gallium nitride in supercritical ammonia", Journal of Crystal Growth 222 (2001) pp. 431-434.*
Melnik et al. "Properties of Free-Standing GaN Bulk Crystals Grown by HPVE", Mat. Res. Soc. Symp. Proc. vol. 482 (1998) pp. 269-274.*
Balkas et al. "Growth of Bulk AlN and GaN Single Crystals by Sublimation", Mat. Res. Soc. Symp. Proc. vol. 449 (1997) pp. 41-46.*
Porowski et al. "Bulk and Homeoepitaxial GaN-Growth and Characterisation", Journal of Crystal Growth, 189/190 (1998) pp. 153-158.*
Motoki, Kensaku et al. (2001). "Preparation of Large Freestanding GaN Substrates by Hydride Vapor Pase Epitaxy Using GaAs as a starting Substrate," J. Appl. Phys. 40:L140-L143.*
R. Dwilinski et al. (1998). "Ammono Method of GaN and AlN Production," Diamond and Related Materials vol. 7: pp. 1348-1350.*
U.S. Office Action dated Nov. 14, 2006, directed at counterpart U.S. Appl. No. 10/682,891.
Japanese Office Action dated Dec. 26, 2006, directed at counterpart JP application No. 2003-544869.
Chinese Office Action dated Dec. 28, 2007, directed to counterpart CN application No. 02802023.5; 8 pages.
Polish Patent Office Notification dated Jan. 15, 2007, directed at corresponding Polish Application No. P-347918.
Polish Search Report dated Jan. 15, 2007, directed at corresponding Polish Application No. P-347918.
U.S. Office Action dated Mar. 21, 2007, directed at corresponding U.S. Appl. No. 10/479,857.
Penkala, Tadeusz. (1972). *Zarys krystalografii (Basics of Crystallography)* PWN, ed., Warszawa: 349 and verified English translation.
N. I-O. Ikornikova. (1975). *Hydrothermal synthesis of crystals in chloride systems*. Izd. Nauka, ed. Moscow: 124-125; 132-133 and verified English translation.
Peters, D. (1990). "Ammonothermal Synthesis of Aluminium Nitride," *Journal of Crystal Growth* 104:411-418.
Sangwal, Keshra, ed. (1994). "Growth apparatus" Chapter 10.3 *In Elementary Crystal Growth*. Lublin: 331.
Purdy, Andrew P. (1999). "Ammonothermal Synthesis of Cubic Gallium Nitride," *Chem. Mater.* 11:1648-1651.
Lan et al. (2000). "Syntheses and structure of nanocrystalline gallium nitride obtained from ammonothermal method using lithium metal as mineralizator," *Materials Research Bulletin* 35:2325-2330.
Yamane, Hisanori et al. (1998) "Morphology and Characterization of GaN Single Crystals Grown in a Na Flux," Journal of Crystal Growth 186, pp. 8-12.
Yamane, Hisanori et al. (1998) "Na Flux Growth of GaN Single Crystals," Journal of the Japanese Association for Crystal Growth 25(4), pp. 14-18, with partial English translation.
Waltereit, P. et al. (2000) "Nitride Semiconductors Free of Electrostatic Fields for Efficient White Light-Emitting Diodes," *Nature* 406, pp. 865-868.
Brandt, O. et al. (1999) "Critical Issues for the Growth of High-Quality (Al,Ga) N/GaN and GaN/(In,Ga)N Heterostructures on SiC(0001) by Molecular-Beam Epitaxy," Applied Physics Letters 75(25), pp. 4019-4021.
Notification from Japanese Patent Office mailed Mar. 14, 2006, directed to JP Application No. 2003-503867, with partial English translation.
Chinese Office Action mailed Mar. 3, 2006, directed to corresponding CN Application No. 02821230.4.
Office Action mailed Mar. 24, 2006, directed to related U.S. Appl. No. 10/493,594.
Office Action mailed Apr. 20, 2006, directed to related U.S. Appl. No. 10/493,747.
Shin-ichi Hirano et al. (1989) "Hydrothermal Synthesis of Gallium Orthophosphate Crystals," Bull. Chem. Soc. Jpn. 62, pp. 275-278.
(1997). "Single Crystal Growth," Chapter 1 *In* Hydrothermal Synthesis Handbook. Gihodo Press, Second Edition, pp. 245-255.
R. A. Laudise (1991). "What is Materials Chemistry?" Chapter 27 *In* Materials for NonLinear Optics: Chemical Perspectives. American Chemical Society. pp. 410-433.
Noboru Sakagami et al. (1974) "Growth Kinetics and Morphology of ZnO. Single Crystal Grown under Hydrothermal Conditions," *Journal of the Ceramic Association* 82, pp. 405-413.
T. Sekiguchi et al. (2000) "Hydrothermal Growth of ZnO Single Crystals and their Optical Characterization," *Journal of Crystal Growth* 214/215, pp. 72-76.
K. Yanagisawa et al. (1996) "Hydrothermal Single Growth of Calcite in Ammonium Acetate Solution," *Journal of Crystal Growth* 163, pp. 285-294.
K. Yanagisawa et al. (2001) "Improvement of Quality of Hydrothermally Grown Calcite Single Crystals," *Journal of Crystal Growth* 229, pp. 440-444.
S. Hirano (1991) "Growth of Gallium Orhophosphate Single Crystals in Acidic Hydrothermal Solutions," *Journal of Materials Science* 24, pp. 2805-2808.
Notification from Japanese Patent Office dated Mar. 29, 2005 and Submission of Printed Publication.
Porowski, S. (1996). "High pressure growth of GaN—new prospects for blue lasers," *Journal of Crystal Growth* 166:583-589.
Chinese Office Action dated Apr. 13, 2007, directed to counterpart CN application No. 02802023.
Chinese Office Action mailed Apr. 8, 2005.
Chinese Office Action dated Aug. 5, 2005, directed to corresponding foreign application.
U.S. Office Action dated Apr. 20, 2005, directed to corresponding U.S. Appl. No. 10/479,807.
U.S. Office Action dated Aug. 2, 2005, directed to corresponding U.S. Appl. No. 10/493,594.
Xiang-jun Mao et al. (2000). "New Concept Technology Pressure-Variation Liquid Phase Epitaxy," SPIE Photonics Taiwan Conference Proceedings Jul. 2000: 12 pages.
Yu Melnik et al. (1998). "Properties of Free-Standing GaN Bulk Crystals Grown by HVPE," Mat. Res. Soc. Symp. Proc. vol. 482: pp. 269-274.
C.M. Balkas et al. (1997). "Growth of Bulk AlN and GaN Single Crystals by Sublimation," Mat. Res. Soc. Symp. Proc. vol. 449: pp. 41-46.
Sylwester Porowski. (1998). "Bulk and Homoepitaxial GaN-Growth and Characterisation," Journal of Crystal Growth vol. 189/190: pp. 153-158.
Hisanori Yamane et al. (1998). "Polarity of GaN Single Crystals Prepared with Na Flux," Jpn. J. Appl. Phys. vol. 37: pp. 3436-3440.
Masato Aoki et al. (2000). "Growth of GaN Single Crystals from a Na-Ga Melt at 750°C. and 5MPa of $N_2$," Journal of Crystal Growth vol. 218: pp. 7-12.

R. Dwilinski et al. (1998). "Ammono Method of BN, AlN and GaN Synthesis and Crystal Growth," MRS Internet Journal Nitride Semiconductor Research 3, 25: 4 Pages.

Masaichi Yano et al. (1999). "Control of Nucleation Site and Growth Orientation of Bulk GaN Crystals," Jpn. J. Appl. Phys. vol. 38, Pt. 2, No. 10A: pp. L1121-L1123.

R. Dwilinski et al. (1998). "Ammono Method of GaN and AlN Production," Diamond and Related Materials vol. 7: pp. 1348-1350.

R. Dwilinski et al. (1997). "Exciton Photo-Luminescence of GaN Bulk Crystals Grown by the Ammono Method," Materials Science and Engineering B50: pp. 46-49.

Douglas R. Ketchum et al. (2001). "Crystal Growth of Gallium Nitride in Supercritical Ammonia," Journal of Crystal Growth vol. 222: pp. 431-434.

R. Dwilinski et al. (1996). "On GaN Crystallization by Ammonothermal Method," vol. 90, No. 4: pp. 763-766.

K. Pakula et al. (1995). "Growth of GaN Metalorganic Chemical Vapour Deposition Layers on GaN Single Crystals," Acta Physica Polonica A vol. 88: pp. 861-864.

M. Palczewska et al. (1998). "Paramagnetic Defects in GaN," MRS Internet Journal Nitride Semiconductor Research 3, 45.

Izabella Grzegory (2001). "High Pressure Growth of Bulk GaN from Solutions in Gallium," Journal of Phys. Condens. Matter vol. 13: pp. 6875-6892.

O. Oda et al. (2000). "GaN Bulk Substrates for GaN Based LEDs and LDs," Phys. Stat. Sol. vol. 180: pp. 51-58.

Akito Kuramata et al. (1996). "Substrates for III-V Nitride Semiconductors," Oyo Buturi vol. 65, No. 9: pp. 936-940.

European Search Report dated Aug. 22, 2007, directed to counterpart EP application No. 02775396.1.

Akasaki, I. et al. (1991). "Growth and Properties of Single Crystalline GaN Films by Hydride Vapor Phase Epitaxy," *Crystal Properties and Preparation* 32-34:154-157.

Chu, T. L. et al. (1974). "Crystal Growth and Characterization of Gallium Nitride," *J. Electrochem. Soc.: Solid-State Science and Technology* 121-1:159-162.

Kaschner, A. et al. (1999). "Influence of Doping on the Lattice Dynamics of Gallium Nitride," *MRS Internet J. Nitride Semicond. Res.* 4S1, G3.57.

Kim, S. T. et al. (1998). "Preparation and Properties of Free-standing HVPE Grown GaN Substrates," *Journal of Crystal Growth* 194:37-42.

Kuroda, Naotaka et al. (1998). "Precise Control of Pn-junction Profiles for GaN-based LD structures Using GaN Substrates with Low Dislocation Densities," *Journal of Crystal Growth* 189/190:551-555.

Motoki, Kensaku et al. (2001). "Preparation of Large Freestanding GaN Substrates by Hydride Vapor Phase Epitaxy Using GaAs as a Starting Substrate," *J. Appl. Phys.* 40:L140-L143.

Sze, S.M. (1998). "Appendix G: Properties of Important Element and Binary Semiconductors," in *Modern Semiconductor Device Physics*. John Wiley & Sons, Inc. New York. Esp. pp. 539-540.

M. Fukuda. (1999) *Optical Semiconductor Devices*; Wiley Series in Microwave and Optical Engineering.Chang, K., John Wiley & Sons, Inc. New York. Esp. pp. 7.

U.S. Office Action, mailed Apr. 15, 2008, directed to related U.S. Appl. No. 10/493,594. 27 pages.

U.S. Office Action, mailed on Oct. 27, 2008, directed to related U.S. Appl. No. 10/493,594; 23 pages.

Supplementary European Search Report, dated Sep. 23, 2008, European Patent U.S. Appl. No. 02788783.5; 3 pages.

Chinese Office Action, dated Jul. 18, 2008, directed to Chinese Patent Application No. 200580040008.X; 25 pages.

Japanese Notification of Reason(s) for Refusal, mailed Dec. 16, 2008, directed to Japanese Patent Application No. 2004-505416; 7 pages.

Japanese Notification of Reason(s) for Refusal, mailed Jan. 6, 2009, directed to Japanese Patent Application No. 2004-506101; 7 pages.

International Search Report, mailed May 7, 2004, directed to International Patent Application No. PCT/JP03/15906; 3 pages.

International Search Report, mailed Sep. 29, 2005, directed to International Patent Application No. PCT/JP2005/011091; 3 pages.

International Search Report, mailed Apr. 21, 2006, directed to International Patent Application No. PCT/JP2005/022396; 3 pages.

U.S. Office Action, mailed Oct. 16, 2007, directed to U.S. Appl. No. 10/538,654; 10 pages.

U.S. Office Action, mailed Apr. 2, 2007, directed to U.S. Appl. No. 10/538,407; 13 pages.

Song, Y. et al. (2003)."Bulk GaN Single Crystals: Growth Conditions by Flux Method." *Journal of Crystal Growth*.247:275-279.

Beaumont, B. et al. (2001)."Epitaxial Lateral Overgrowth of GaN." *Phys. Stat. Sol.*(b).227(1);1-43.

Liu, L. et al. (2002). "Substrates for Gallium Nitride Epitaxy." Reports: *A Review Journal, Materials Science and Engineering*:37:61-127.

Yano, M. et al. (2000). "Growth of Nitride Crystals, BN, AlN and GaN by Using a Na Flux" *Diamond and Related Materials*. 9:512-515.

Kelly, M. K. et al. (Sep. 16, 1996). "Optical Patterning of GaN Films." *American Institute of Physics Appl. Phys. Lett.* 69:1749-1751.

Wong, S. W. et al. (Sep. 6, 1999). "Fabrication of Thin-Film InGaN Light-Emitting Diode Membranes by Laser Lift-Off." *American Institute of Physics Applied Physics Letter*. 75(10):1360-1362.

Porowski, S. et al. (1993). "Prospects for High-Pressure Crystals Growth of III-V Nitrides." *Inst. Phys. Conf. Ser*. 13(4):369-372.

Peters, D. (1990)."Ammonothermal Synthesis of Aluminium Nitride." *Journal of Crystal Growth*. 104:411-418.

Inoue, T. et al. (2001)."Growth of Bulk GaN Single Crystals by the Pressure-Controlled Solution Growth Method." *Journal of Crystal Growth*.229:35-40.

Kolis, J. W. et al. (1998)."Materials Chemistry and Bulk Crystal Growth of Group III Nitrides in Supercritical Ammonia." Materials Research Society Symp. Proc. 495:367-372.

* cited by examiner

PHOSPHOR SINGLE CRYSTAL SUBSTRATE AND METHOD FOR PREPARING THE SAME, AND NITRIDE SEMICONDUCTOR COMPONENT USING THE SAME

TECHNICAL FIELD

The present invention relates to a phosphor bulk single crystal substrate formed by crystallization from supercritical solution and a method for preparing the same, and a light emitting device using the substrate.

BACKGROUND ART

To realize the white light emitting from blue light emitting by converting a wavelength from a nitride semiconductor light emitting device, a device of combination with a gallium nitride light emitting device and YAG:Ce phosphor is proposed. The mechanism for obtaining the white light from emitting device of converting a wavelength generally comprises steps of mixing phosphor powder into coating of LED chip or mold resin, absorbing a part of the emitted light from the chip into the phosphor, exciting a phosphor, mixing the excited light from the phosphor with the emitted light from the chip which is not absorbed, and forming a mixed colored light.

However, the method for manufacturing the phosphor layer using the phosphor mixed with the coating or mold resin has some problems: the degree of dispersion of the phosphor in the resin is varied by descending the phosphor during a process of solidifying the resin, uniform mixed color cannot be obtained, and the yield is very low.

To overcome aforementioned problems, it was attempted that the gallium nitride semiconductor layer was formed directly on the substrate obtained by YAG single crystal to obtain a uniform phosphor layer, but it was found that it was difficult to carry out the vapor phase growth of the gallium nitride crystal on the YAG crystal through the buffer layer.

DISCLOSURE OF THE INVENTION

The object of the present invention is to provide a phosphor single crystal substrate in which a gallium nitride crystal can be grown in the vapor phase and also provide a light emitting device of converting wavelength in high yield, which could not be obtained by the powdered phosphor.

The inventors of the present invention found the method for obtaining the nitride bulk single crystal by recrystallizing from supercritical ammonia-containing solution. (as shown Japanese Patent Application No. 2002-143449) On the other hand, a phosphor in the form of GaN doped with Zn or Cd is disclosed in Japanese Patent Laid-Open Publication No. 51-41686. In this procedure the nitride reaction of gallium oxide occurred indeed on a surface of grains, however there are a lot of problems with reaching a 100% yield. Additionally, the phosphor produced has a low crystalline quality and a low spectral reflectance. When the phosphor is excited with UV rays or the electron beams, the phosphor can emit light of unsatisfactory properties and it would be hard to use such a phosphor in, for example, a fluorescent display. However, the inventors of the present invention found that when ammonia reacts with metallic gallium or other elements of the Group XIII (IUPAC 1989) in the presence of alkali metal or its compounds and the nitride phosphor can be prepared by crystallization from supercritical ammonia-containing solution, the synthesis reaction of nitride, for example GaN, can be accelerated, which makes it possible for the obtained nitride phosphor to have a uniform composition, a high spectral reflectance and a good crystalline quality, and also which makes it possible for obtained nitride phosphor to emit the light effectively when excited with the UV rays or electron beams, which means the phosphor is useful for devices such as fluorescent displays.

EXAMPLES

A crucible made of the nickel alloy of an inner diameter of 10 mm is charged with 1 g of metallic gallium and 0.1 g of metallic Zn, followed by introducing the crucible into a high-pressure autoclave of an inner diameter 14 mm and a height of 70 mm. The autoclave is charged then in a dry glove box with $LiNH_2$, sealed and evacuated of gases with a special system, and 4.9 g of ammonia is dropped into the reaction chamber. After re-sealing, the autoclave is placed in a furnace and heated to 550° C., with the pressure in the autoclave reaching about 4000 bar. The autoclave is allowed to stay in these conditions for 1 week, then the temperature is lowered to the room temperature, and consequently the pressure in the autoclave is lowered to about 10 bar. After evacuation of ammonia the autoclave is placed inside a dry glove box and the crucible removed. The crucible contents are washed with water, to allow hydrolysis and washing off $LiNH_2$ in the form of well water-soluble LiOH. The solid residues from the crucible are dried and resulted in a phosphor of GaN:Zn type in the form of a white powder. Photographs of the phosphor taken by a field emission scanning electron microscope (25000× magnitude) illustrate many crystallites of the shape of hexagonal prism, indicating a good crystalline quality of the phosphor.

The obtained phosphor is illuminated with the UV rays of the wavelength of 365 nm, followed by measuring its luminescence spectrum. The measurement results are shown in FIG. 7. The same phosphor is also placed in the electron beams of the voltage of 7 kV and the current density of 0.5 $\mu A/cm^3$, and the results of cathodoluminescence measurements are shown in FIG. 8. Both plots show that the obtained phosphor may be efficiently excited with UV rays or electron beams and can emit the blue light. The emission luminance acquired by exciting the phosphor of the invention with UV rays or electron beams reached accordingly 156% and 160% of the emission luminance of the GaN:Zn phosphor produced according the process as described in Japanese Patent Laid-Open Publication No. 51-41686. This means that the significant enhancement of the emission properties of the phosphor is achieved.

The obtained phosphor is also analyzed by an X-ray diffraction with an X-ray powder diffractometer. The recorded diffractograms are shown in FIG. 9. The diffractograms revealed that phosphor has the crystal structure of a wurtzite, belonging to hexagonal system. For the lattice constants, the a-axis length is 3.189 angstroms, and the c-axis length is 5.185 angstroms. Further, based on Scherrer equation, the diameter of crystallites in the (102) direction is calculated. The diameter of crystallites of the phosphor GaN:Zn produced according to the process of Japanese Patent Laid-Open Publication No. 51-41686 is 285 angstroms, whilst the diameter of crystallites of the phosphor of the invention is 857 angstroms. For wavelengths in the range of 380 nm to 730 nm a spectral reflectance of the produced phosphor is also measured. The results are shown in FIG. 10, where the measurement is relative in character, i.e. made under the assumption that a spectral reflectance of a typical standard—a white barium sulphate—is 100%. FIG. 10 shows that the color of the phosphor of the invention is white and that a spectral reflectance is not less then 70% in a range of wavelengths of 430 nm to 730 nm. Since the phosphor of the invention has a high spectral reflectance and a light absorption thereof is small, it can emit light efficiently.

Accordingly, the object of the present invention is to provide a nitride phosphor bulk single crystal by crystallization from supercritical ammonia-containing solution and to provide a light emitting device of converting wavelength having good yield by using the phosphor as a substrate.

The phosphor substrate bulk single crystal is a nitride having a general formula XN, XN:Y or XN:Y,Z, wherein X is at least one element selected from B, Al, Ga and In, Y is at least one element selected from Be, Mg, Ca, Sr, Ba, Zn, Cd and Hg, and Z is at least one element selected from C, Si, Ge, Sn, Pb, O and S.

The present invention is based on the reaction between ammonia and the element of Group XIII or a compound thereof at a temperature not lower than 132° C. and under a pressure not less then 112 bar in the presence of at least one element selected from Group I and Group II and/or compounds thereof, such as hydrides, imides, amides and nitrides.

When a metal or its compound including at least one element selected from B, Al, Ga or In reacts with $NH_3$ in conditions above its critical point (132° C., 112 bar), the nitride reaction essentially takes place, but its rate is not satisfactory. However, when the reaction environment is supplemented with at least one element selected from Group I and Group II (IUPAC 1989) and/or compounds thereof, such as hydrides, imides, amides and nitrides, the nitriding reaction becomes much faster and efficient. The Group I element may preferably be Li, Na or K, while the Group II element may preferably be Mg or Ca. Nitrides of the Group I elements may preferably include $Li_3N$, $Na_3N$, $K_3N$, their amides may include $LiNH_2$, $NaNH_2$ and $KNH_2$, and imides—$Li_2NH$ etc. Nitrides of the Group II elements may preferably include $Mg_3N_2$, $Ca_3N_2$, their amides may include $Mg(NH_2)_2$, $Ca(NH_2)_2$, and imides—$CaNH$ etc. Thanks to the native nitrogen defects the nitride phosphor obtained according to the invention can emit light even when it is not intentionally doped.

In case of the light emission by a donor-acceptor pair, when the donor comprises a spontaneously originating nitrogen defect, acceptors may be preferably produced with the Group II and Group XII elements, such as Be, Mg, Ca, Sr, Zn, Cd or Hg.

It is preferable to use the reaction between $NH_3$ and at least one co-activator element selected from Group XIV and Group XVI (IUPAC 1989), such as C, Si, Ge, Sn, Pb, O, S and/or compounds thereof.

In case of the light emission by a donor-acceptor pair, donors may be preferably produced with the elements selected from C, Si, Ge, Sn, Pb, O and S, and acceptors may be preferably produced with the elements selected from Be, Mg, Ca, Sr, Zn, Cd and Hg.

The process for obtaining a phosphor bulk single crystal is based on a technique of an ammono-basic growth of a crystal which comprises a chemical transport in a supercritical ammonia-containing solvent containing at least one mineralizer for imparting an ammono-basic property, to grow a nitride single crystal. In this technique, the impurities such as Zn or Cd with feedstock are dissolved in the supercritical solvent and then the obtained crystal is recrystallized on the nitride seed having the optional main plane.

In this regard, the seed enables selective growth of a phosphor substrate.

In the technique of an ammono-basic growth of a crystal, it is found that the crystal growth may be influenced by the composition and concentration of the supercritical ammonia-containing solution, the temperature difference between the dissolution zone and the crystallization zone, the location and area of the baffle by which a convection flow rate is controlled basing on the temperature difference, the filling ratio of ammonia and the ratio of surface area of the seed with respect to that of the feedstock etc. Furthermore, according to the present invention, a convection flow rate of the supercritical solution between dissolution zone 13 and crystallization zone 14 can be determined by the convection control means 2 and the temperature difference, therefore nitride crystal can be selectively grown on the seed by maintaining supersaturation of the supercritical solution with respect to the seed and controlling below a certain concentration so as not to allow spontaneous crystallization.

Moreover, supercritical ammonia-containing solution containing alkali metal ions has an excellent solubility, thereby it is possible to decrease an contamination by impurities from the autoclave inner wall if a lining of metal such as Ag, Mo, Fe or Ta, or alloy thereof is applied to the inner wall of the autoclave.

The convection control means is used to create a temperature gradient between the dissolution zone and the crystallization zone, and the form and area of the convection control means can be varied by the volume of the autoclave and the ratio of inside diameter to the total length of the autoclave. It is preferable that the convection control means may be formed within the range of 70% to 90% of the inner cross-sectional area of the autoclave and the ratio of opening in baffle may be set at 30% or less. The location of baffle may be adjusted in accordance with the quantity of the grown crystal and the baffle may be located within the range from $\frac{1}{3}$ to $\frac{2}{3}$ of the total length of the inner chamber of the autoclave, thereby to adjust the ratio between the dissolution zone and the crystallization zone to a desired value. It is preferable that the feedstock is placed in the dissolution zone and the filling ratio of the feedstock is less than half of the dissolution zone. In case that the feedstock is in the form of gallium metal, the filling ratio of the feedstock may be about $\frac{1}{4}$ of the dissolution zone, because the volume of the feedstock will be increased by transforming from gallium metal to poly-GaN in the crucible.

In the area of the convection control means 2, it is preferable that the cooling device 6 is arranged for cooling so that it is easier to make a predetermined temperature difference between the dissolution zone 13 and the crystallization 14. It is also preferable that the cooling device 18, which can cool the bottom of the flowing area of the crystallization zone, is placed in the autoclave and thereby rapid cooling function is executed after crystallization.

Using the above-specified constitution of the autoclave, it is possible to improve the growth rate on a seed. It is preferable that the ratio of diameter to total length of the autoclave may be set from $\frac{1}{15}$ to $\frac{1}{3}$, the ratio of opening in the horizontal baffle on the cross-sectional area may be set at 30% or less and growth rate on a seed-may be 10 μm/hr or more.

BEST MODE FOR CARRYING OUT THE INVENTION

Figure 1:
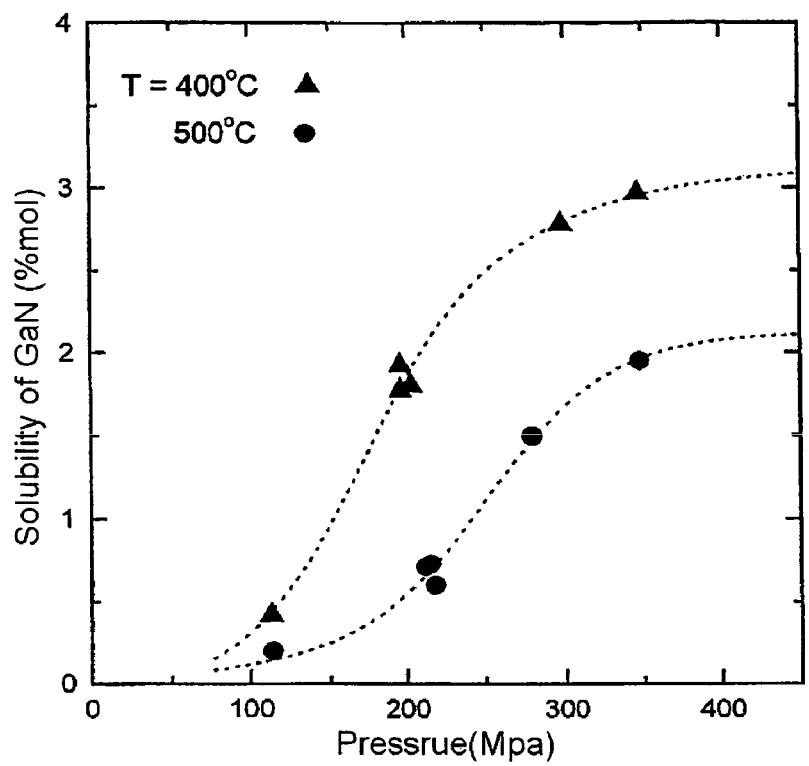
FIG. 1 shows a relation between pressure and GaN solubility in the supercritical ammonia containing potassium amide (at molar ratio of $KNH_2:NH_3=0.07$) at T=400° C. and T=500° C.

The apparatus for obtaining a bulk single crystal comprises an autoclave 1 for preparing a supercritical solvent equipped with a convection control means 2 for establishing a convection flow, and at least one furnace unit 4 equipped with a heating device 5 and a cooling device 6 on the autoclave. The furnace unit includes a higher temperature zone 14 equipped with a heating device 4, which corresponds to a crystallization zone in the autoclave, and a lower temperature zone 13 equipped with a heating device which corresponds to a dissolution zone in the autoclave. It is also possible to use a furnace unit which includes a higher temperature zone equipped with a heating device, and/or cooling device, and a lower temperature zone equipped with a heating device and/or cooling device. The convection control means for establishing a convection flow is composed of at least one horizontal baffle having a central opening and/or a periphery space so as to devide the crystallization zone from the dissolution zone. Thus, the feedstock is set in the dissolution zone, and the seed is set in the crystallization zone, in the autoclave. The convection flow of the supercritical solution between the dissolution zone and the crystallization zone is controlled by the convection control means. The dissolution zone is located above the horizontal baffle, and the crystallization zone is located below the horizontal baffle.

Figure 4:
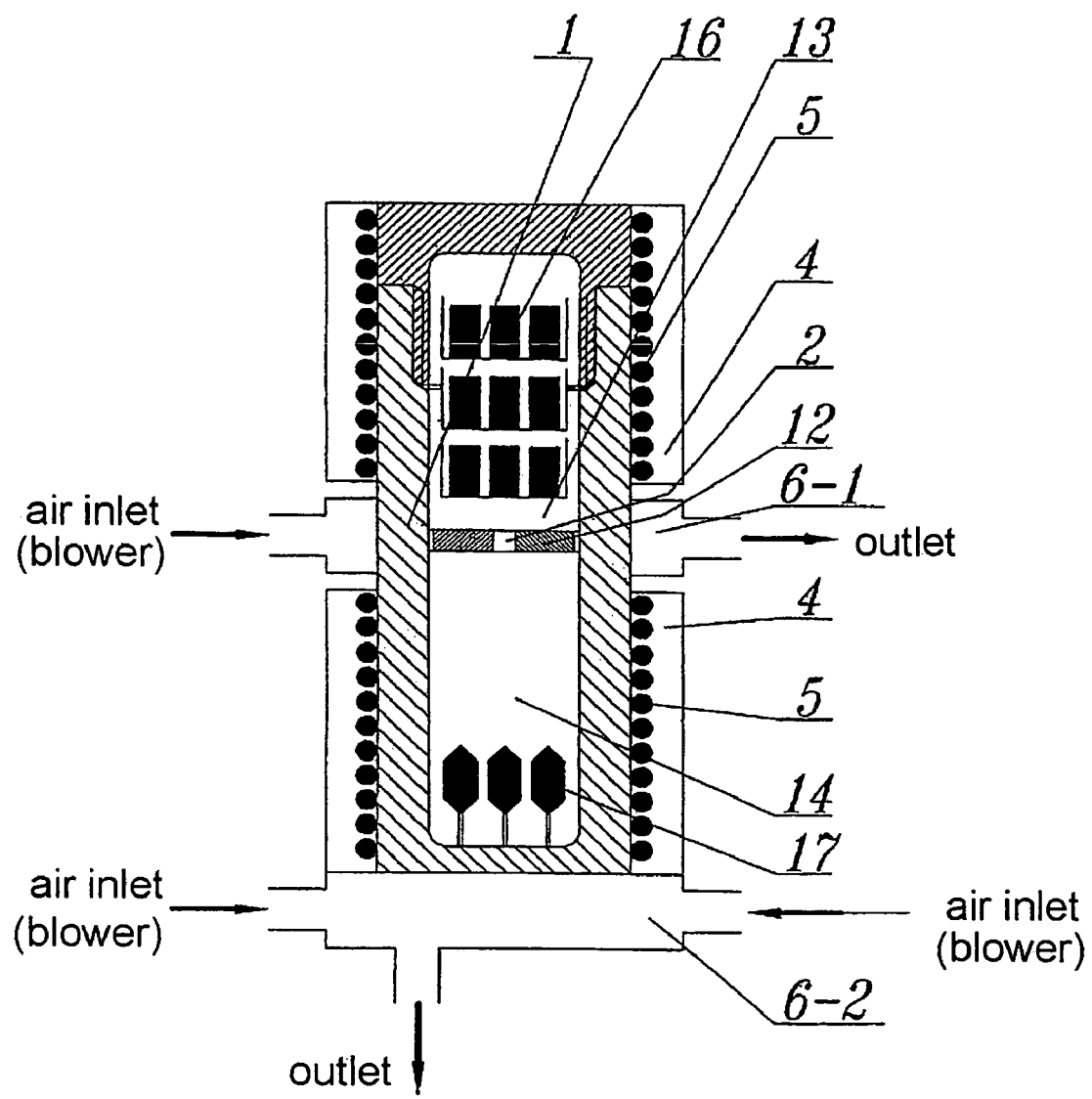
FIG. 4 is a schematic cross-sectional view of an autoclave and a furnace unit used in this invention.
Figure 5:
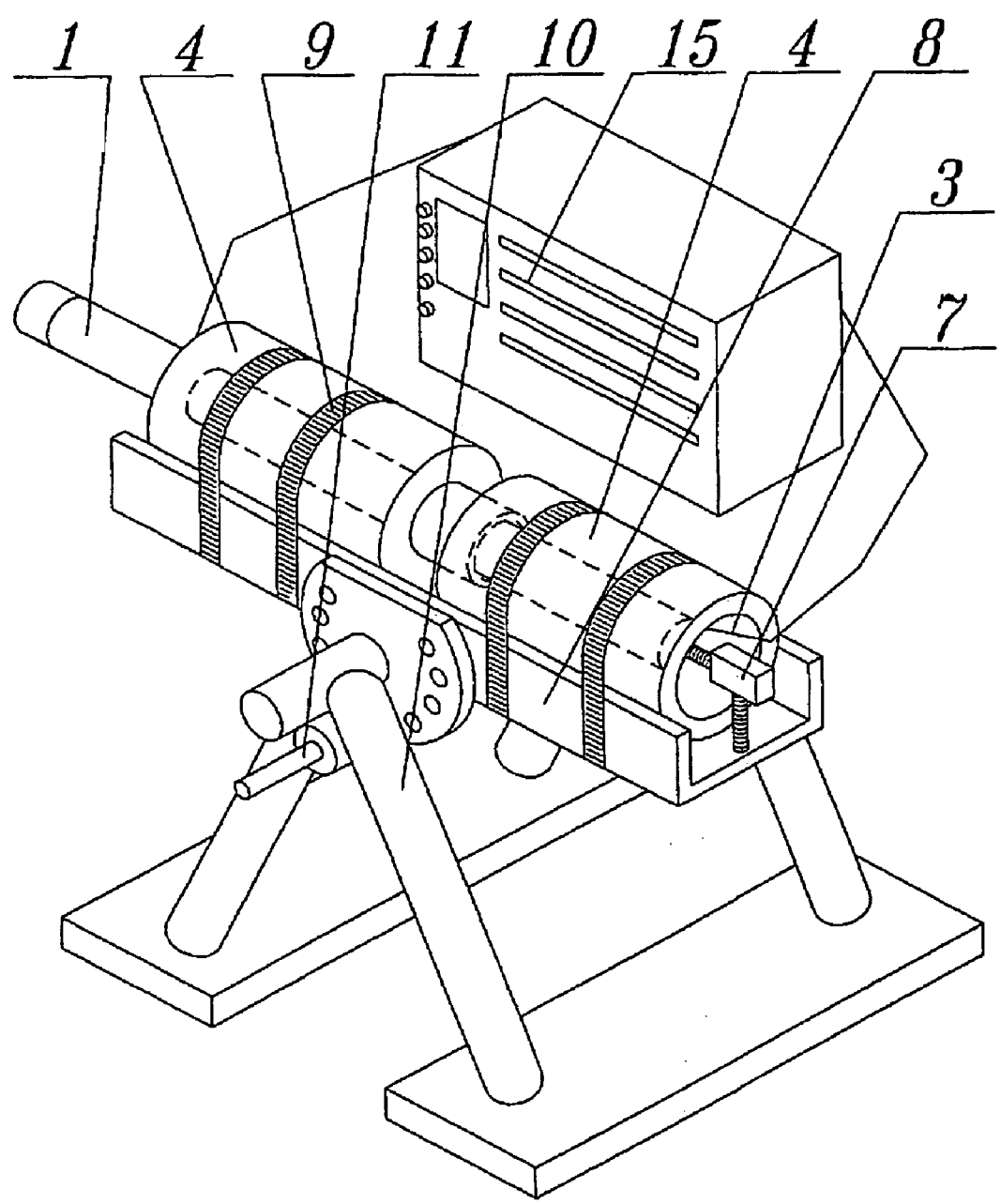
FIG. 5 is a schematic perspective view of an apparatus for obtaining a nitride bulk single crystal.

The apparatus for obtaining a bulk single crystal according to the present invention is illustrated in FIG. 4 and FIG. 5. The main part of the apparatus comprises the autoclave 1 used for preparing a supercritical solvent and the convection control means 2 which enhances chemical transport in the supercritical solution within the autoclave 1. The autoclave 1 is situated in the chamber 3 of the furnace unit 4 (2 sets), equipped with the heating device 5 and the cooling device 6. The autoclave 1 within the furnace unit 4 is secured by a screw blocking device 7. The furnace 4 is embedded in the bed 8 and secured with steel tapes 9 tightly wound around the furnace unit 4 and the bed 8. The bed 8 with the furnace unit 4 is pivotally mounted on the turntable 10 and secured in the desired position by means of a pin securing device 11, so that the convective form and convection flow in the autoclave can be controlled. The convection flow of the supercritical solution in the autoclave 1 placed in the furnace unit 4 is established by means of the convection control means 2, which is composed of the horizontal baffle 12 of a size corresponding to about 70% of horizontal cross-sectional area of the autoclave 1, dividing the crystallization zone from the dissolution zone. The horizontal baffle 12 is located approximately in the middle of the autoclave 1 in terms of longitudinal dimension. Temperature values in each zone of the autoclave 1, falling within the range from 100° C. to 800° C., are controlled by a control unit 15 placed near the furnace unit 4. In the autoclave 1 the dissolution zone 13 corresponding to the lower temperature zone of the furnace unit 4 is situated above the horizontal baffle 12. The feedstock 16 is placed in the dissolution zone 13 and the amount of the feedstock 16 is such that its volume does not exceed ½ of volume of the dissolution zone. Simultaneously, when metallic gallium is introduced as a feedstock in crucible, the total volume of the crucible should not exceed ½ of volume of the dissolution zone. The crystallization zone 14 corresponding to higher temperature zone of the furnace unit 4 is situated below the horizontal baffle 12. In the crystallization zone 14 the seed 17 is located and the specific position in which the seed 17 is placed is below crossing of up-stream convection flow and down-stream convection flow, but still above the bottom of the crystallization zone. The cooling device 6-1 for cooling is placed within the zone of the convection control means 2. As the result, the predetermined temperature difference between the dissolution zone 13 and the crystallization zone 14 may be controlled. At the level of the bottom of the crystallization zone there is another cooling device 6-2, used in order to cool down the zone after the crystallizing process is over, so that the dissolution of the grown crystal during the cooling stage after the crystallizing process can be remarkably prevented.

According to the result of the research, GaN exhibits good solubility in $NH_3$ including alkali metals or their compounds, such as $KNH_2$. The graph in FIG. 1 presents how solubility of GaN in supercritical solvent depends on pressure, for temperature 400° C. and 500° C. Here the solubility is defined as the molar percentage: $S_m \equiv [GaN^{solution}:(KNH_2+NH_3)] \times 100\%$. In this case, the solvent is the supercritical ammonia-containing solution in which the molar ratio $X \equiv KNH_2:NH_3$ is set at 0.07. Solubility $S_m$ may be a function of three parameters: temperature, pressure, and molar ratio of the mineralizer, i.e. $S_m \equiv S_m$ (T, p, x). Small changes of $\Delta S_m$ can be expressed as:

$$\Delta S_m \approx (\partial S_m/\partial T)_{p,x}\Delta T + (\partial S_m/\partial p)_{T,x}\Delta P + (\partial S_m/\partial x)_{T,x}\Delta x,$$

where the parameters in the partial derivatives, e.g. each coefficient of $(\partial S_m/\partial T)_{p,x}$ and so on, is defined as a temperature coefficient of the solubility and a pressure of the solubility, and a molar ratio coefficient of the mineralizer.

As it results form the above graph presented in FIG. 1, the solubility of the nitride in the supercritical ammonia-containing solution is an increasing function of pressure and a decreasing function of temperature. On the basis of these dependences it is possible to obtain GaN bulk single crystal by dissolving it under higher solubility conditions and crystallizing under lower solubility conditions. Negative temperature coefficient of solubility means that in the presence of a temperature gradient the chemical transport of nitride occurs from the lower temperature dissolution zone to the higher temperature crystallization zone. Furthermore, it is also found that other gallium compounds and metallic gallium can be used as a supplier for GaN complex.

For example, Ga complex, such as metallic gallium which is the simplest element can be introduced into the above solvent. Next, the supersaturation of solution with respect to nitride is obtained by change of physical conditions such as heating, so that crystal can be grown on a seed. According to the present invention, it is possible to crystallize the desired nitride-bulk single crystal on a seed and also to lead the stoichiometric growth of GaN obtained as a bulk single crystal layer on a seed in the form of GaN crystal.

The obtained single crystal may contain alkali metals at the concentration of 0.1 ppm or more since the single crystal is grown in the supercritical ammonia-containing solution containing alkali metal ions. In view of maintaining the desired ammono-basic character of the supercritical solution, and also in order to avoid corrosion of the apparatus, no halogens are intentionally introduced into the supercritical solvent. According to the present invention, intentional replacing of 0.001 to 0.50 Ga by Al or In may be achieved. The crystal lattice constants of the obtained nitride can be adjusted by an appropriate modification of the composition. GaN bulk single crystal obtained by the process according to the present invention may be also intentionally doped with donor dopants (such as C, Si, Ge, Sn, Pb, O or S etc.), acceptor dopants (such as Be, Mg, Ca, Sr, Zn, Cd, Hg etc.) or magnetic dopants (such as Mn, Cr etc.) in concentrations of $10^{17}$ to $10^{21}$/cm$^3$. The dopants change optical, electrical and magnetic properties of nitride. As for other physical properties, the grown GaN bulk single crystal has a surface dislocation density of $10^6$/cm$^2$ or less, preferably $10^5$/cm$^2$ or less, more preferably $10^4$/cm$^2$ or less, and also has the full width at half maximum of the X-ray from the surface (0002) plane of 600 arcsec. or less., preferably 300 arcsec. or less, more preferably 60 arcsec. or less. It is possible to grow a GaN bulk single crystal as the best which has a surface dislocation density of about $10^4$/cm$^2$ or less, and the full width at half maximum of the X-ray from the surface (0002) of 60 arcsec. or less.

(Temperature Difference Between the Crystallization Zone and the Dissolution Zone)

When two zones, i.e., the dissolution zone and the crystallization zone are simultaneously formed in the autoclave, supersaturation of the supercritical solution with respect to the seed is maintained by controlling the dissolution temperature and the crystallization temperature. The control is found to be easy by setting the temperature of the crystallization zone at 400 to 600° C., and by maintaining the difference in temperature between the dissolution zone and the crystallization zone within the autoclave, at 150° C. or less, preferably 100° C. or less. Preferably, the adjustment of the supersaturation of the supercritical solution with respect to the seed is made by providing at least one baffle for dividing the internal of the autoclave into a lower temperature dissolution zone and a higher temperature crystallization zone, and controlling the convection flow between the dissolution zone and the crystallization zone. Further, when two zones, i.e., a dissolution zone and a crystallization zone, between which a specified temperature difference is set, are formed in the autoclave, the supersaturation of the supercritical solution with respect to the seed is preferably adjusted by using a feedstock having a total surface area larger than the total surface area of the seed.

The present invention relates to a technique of an ammono-basic growth of a crystal which comprises the steps of causing a chemical transport in a supercritical ammonia-containing solvent containing at least one mineralizer for imparting an ammono-basic property, thereby growing a nitride single crystal. The terms herein shoud be understood as having the meanings defined as below in the present specification.

(Nitride)

"Nitride phosphor substrate" in the specification is a compound which includes at least nitrogen atom as a consistent element. The phosphor substrate comprises a nitride having a general formula XN, XN:Y or XN:Y,Z, wherein X is at least one element selected from B, Al, Ga and In, Y is at least one element selected from Be, Mg, Ca, Sr, Ba, Zn, Cd and Hg, and Z is at least one element selected from C, Si, Ge, Sn, Pb, O and S. Moreover the XN can be defined as the general formula $Al_xGa_{1-x-y}In_yN$, where $0 \leq x \leq 1$, $0 \leq y \leq 1$, and $0 \leq x+y \leq 1$, and may contain at least the binary compound such as GaN or AlN, ternary compounds such as AlGaN, InGaN or also quaternary compound AlInGaN. The term "nitride phosphor substrate" means a nitride single crystal substrate which can produce a new light source from converting the luminescence wavelength from LED or LD by combining the substrate with a light emitting device such as LED or LD formed by an epitaxial growing process, for example MOCVD, HVPE or the like.

(Precursor)

The term "a precursor of nitride" means a substance which can be selected from B, Al, Ga or In, and if needed, an alkali metal, an element of the Group XIII, nitrogen and/or hydrogen, or a mixture thereof, and examples of such a precursor include metal, an alloy or an intermetallic compound thereof, and a hydride, amide, imide, amido-imide or azide thereof, which can form a nitride soluble in a supercritical ammonia-containing solvent as defined below.

(Feedstock)

The term "feedstock" means a purposed nitride or a precursor thereof. The process of the present invention is based on an ammono-basic reaction. The feedstock may be GaN or AlN formed by HVPE, or GaN or AlN formed by chemical reactions, which originally may contain chlorine, in so far as the ammono-basic supercritical reaction is not hindered. A combination of nitride which is dissolved in an equilibrium reaction to the supercritical ammonia-containing solvent and metallic gallium or metallic aluminum which irreversibly reacts with the supercritical ammonia-containing solvent can be used as a feedstock.

The control of the reaction for crystallization becomes easy by making use of gallium nitride as the nitride. In this case, the same nitride single crystal is preferably used as a seed. GaN obtained by flux method or vapor phase method such as HVPE method, or polycrystalline gallium nitride poly-crystallized from supercritical ammonia or metallic Ga can be used as a feedstock for GaN.

(Supercritical Ammonia-Containing Solvent)

In the present invention the supercritical solvent may contain $NH_3$ or a derivative thereof. The mineralizer may contain alkali metal ions, at least, ions of sodium or potassium. The term "supercritical ammonia-containing solvent" means a supercritical solvent which may contain at least ammonia, and ion or ions of at least one alkali metal for dissolving nitride and further preferably alkali earth metal.

(Mineralizer)

The term "mineralizer" means a supplier for supplying one or more of alkali metal ions for dissolving nitride in the supercritical ammonia-containing solvent. Mineralizer is introduced in the form of alkali metal compound for imparting alkali metal or alkali metal ions in the supercritical ammonia-containing solvent. In the view of the purity, it is preferable that the mineralizer in the form of alkali metallic azide ($NaN_3$, $KN_3$, $LiN_3$, $CsN_3$), alkali metal amide ($LiNH_2$, $KNH_2$, $NaNH_2$, $CsNH_2$), alkali metallic imide ($Li_2NH$, $K_2NH$, $Na_2NH$, $Cs_2NH$) alkali metal (Na, K, Li, Cs), alkali metallic hydride (LiH, KH, NaH, CsH) or other compound such as $Li_3N$, $K_3N$, $Na_3N$, $Cs_3N$ etc. may be introduced, however, the alkali metal and alkali metallic compound can be simultaneously used, as required. The concentration of alkali metal ions in the supercritical solvent is adjusted so as to ensure the specified solubilities of feedstock or nitride, and the molar ratio of the alkali metal ions to other components of the resultant supercritical solution is controlled within a range from 1:200 to 1:2, preferably from 1:100 to 1:5, more preferably from 1:20 to 1:8. In case of using the combination of two or more elements of alkali metal ions, the rate of crystal growth and crystal quality can be improved more, compared with the case where only one element of alkali metal ion is used. Moreover an alkaline earth metal, such as Mg, Zn or Cd, can be simultaneously used, as required. Furthermore, neutral element (alkali metal halide), acidic element (ammonium halide) may be simultaneously used, in so far as the ammono-basic supercritical reaction is not hindered.

(Dissolution of Feedstock)

Dissolution of feedstock is a reversible or irreversible process where the feedstock is in the form of nitride compounds soluble in the supercritical solvent, for example gallium complex compound or aluminum complex compound. Gallium complex compound is a chemical complex compound, in which a centrally placed gallium atom is surrounded by $NH_3$ type ligands or their derivatives, such as $NH_2^-$, $NH^{2-}$.

(Supercritical Ammonia-containing Solution)

The term "supercritical ammonia-containing solution" means a soluble gallium or aluminum compounds formed by the dissolution of the feedstock in the supercritical ammonia-containing solvent. Based on our experiments, we have found that there is an equilibrium relationship between the metallic nitride solid and the supercritical solution under sufficiently high temperature and pressure conditions. Accordingly, the solubility of the soluble nitride can be defined as the equilibrium concentration of the above soluble gallium or aluminum compounds in the presence of solid nitride. In such a process, it is possible to shift this equilibrium by changing temperature and/or pressure.

(Solubility)

Figure 2:
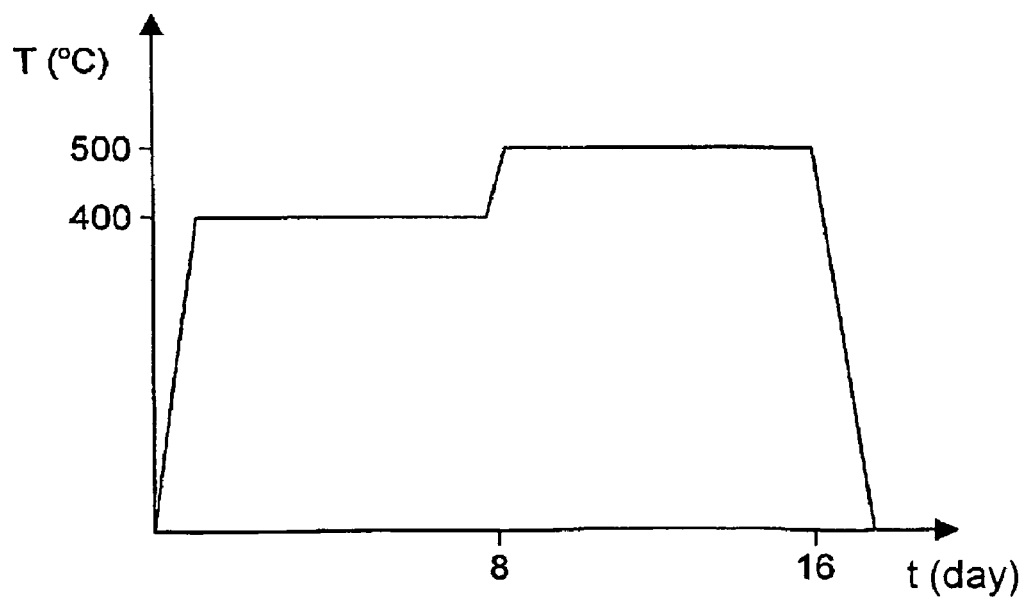
FIG. 2 shows a graph illustrating a relation of change in temperature in an autoclave with the passage of time and change between a dissolution step and a crystallization step, where the pressure is kept constant.
Figure 3:
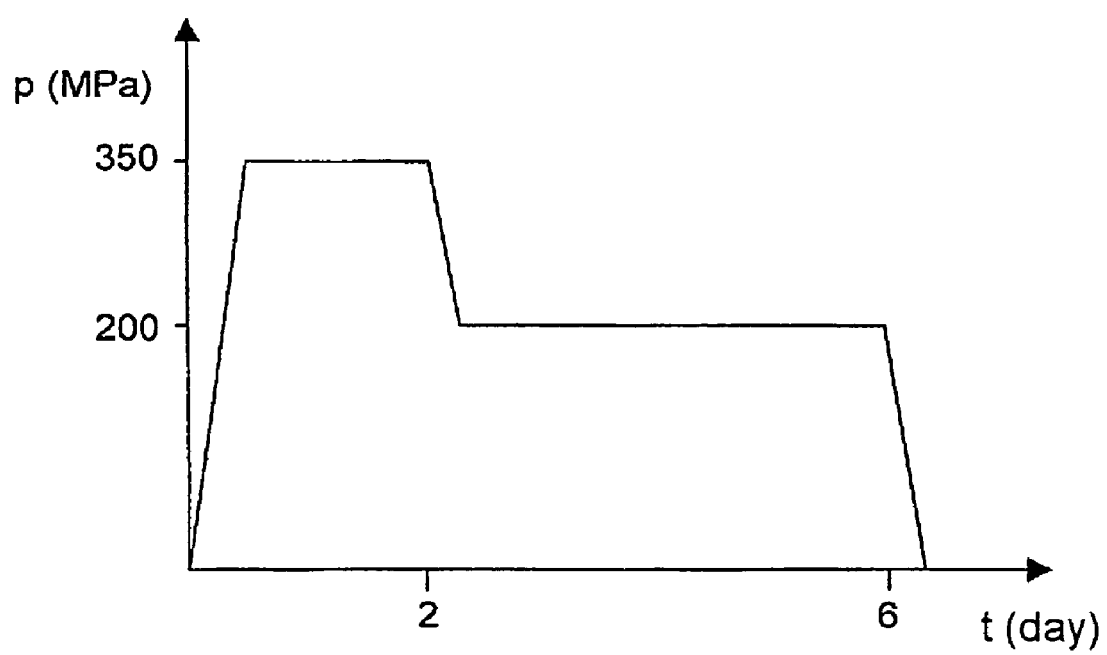
FIG. 3 shows a graph illustrating a relation of change in pressure in an autoclave with the passage of time and change between a dissolution step and a crystallization step, where the temperature is kept constant.

The phrase "negative temperature coefficient of solubility" means that the solubility is expressed by a monotonically decreasing function of the temperature, when all other parameters are kept constant. Similarly, the phrase "positive pressure coefficient of solubility" means that the solubility is expressed by a monotonically increasing function of the pressure, when all other parameters are kept constant. Based on our research, the solubility of nitride in the supercritical ammonia-containing solvent has a negative temperature coefficient within a range of 300 to 550° C., and a positive pressure coefficient within the range of 1 to 5.5 kbar, respectively. For example, as shown in FIG. 2, after dissolution of feedstock in an autoclave kept for 8 days at the temperature 400° C. (i.e. after dissolution step), crystallization of gallium nitride may be achieved by increasing the temperature inside the autoclave to 500° C. (crystallization step). On the other hand, as shown in FIG. 3, after dissolution of a feedstock at increased pressure in an autoclave kept for 2 days at the level of 3.5 kbar (i.e. after dissolution step), crystallization of gallium nitride is achieved by means of reducing the pressure to 2 kbar in the autoclave (crystallization step).

(Supersaturation)

The phrase "supersaturation of the supercritical ammonia-containing solution with respect to the nitride" means that the concentration of the soluble gallium or aluminum compounds in the supercritical ammonia-containing solution is higher than the concentration in the equilibrium state, i.e., the solubility of nitride. In case of the dissolution of nitride in a closed system, such supersaturation can be achieved, according to the negative temperature coefficient or the positive pressure coefficient of solubility, by raising the temperature or reducing the pressure.

(Chemical Transport)

The phrase "the chemical transport of nitride in the supercritical ammonia-containing solution" means a sequential process including the dissolution of the feedstock, the transfer of the soluble nitride through the supercritical ammonia-containing solution, and the crystallization of nitride from the supersaturated supercritical ammonia-containing solution. In general, a chemical transport process is carried out by a certain driving force such as a temperature gradient, a pressure gradient, a concentration gradient, difference in chemical or physical properties between the dissolved feedstock and the crystallized product, or the like. Preferably, the chemical transport in the process of the present invention is achieved by carrying out the dissolution step and the crystallization step in separate zones, provided that the temperature of the crystallization zone is maintained higher than that of the dissolution zone so that the nitride bulk single crystal can be obtained by the processes of this invention.

(Seed)

The term "seed" has been described by way of examples in the present specification. The seed provides a region or area on which the crystallization of nitride is allowed to take place and the growth quality of the crystal depends on the quality of the seed. Thus, the seed of a high quality should be selected. The dislocation density thereof is preferably $10^5/cm^2$ or less. As a seed, a natural seed obtained by flux method or high pressure method, A-plane, M-plane or R-plane seed obtained from bulk single crystal can also be used. Moreover, a seed having a seed surface exhibiting n-type electrical conductivity doped with Si may be used. Such seed can be produced using processes for nitride crystal growth from gaseous phase, such as HVPE or MOCVD, etc. Doping with Si during the growth process at the level of $10^{16}$ to $10^{21}/cm^2$ ensures n-type electric conductivity. Moreover, a composite seed may be used which obtained by depositing a separate phosphor layer on one side of AlN or GaN substrate and a seed on the other side thereof. This can be used when the plural phosphor layers are required.

(Spontaneous Crystallization)

The term "spontaneous crystallization" means an undesirable phenomenon in which the formation and the growth of the core of nitride from the sueprsaturated supercritical ammonia-containing solution occur at any site inside the autoclave, and the spontaneous crystallization also includes disoriented growth of the crystal on the surface of the seed.

(Light Emitting Device)

The light emitting device deposited on the phosphor substrate may have a homogeneous structure or a heterogeneous structure or double heterogeneous structure, such as MIS joint, PIN joint or pn joint. Various luminescence wavelength can be selected in accordance with the element of the semiconductor layer and the mixture ratio of crystal. The semiconductor active layer may have a single quantum well structure or multiple quantum well structure formed on a thin film which enhances the quantum effect, so that the output power thereof can be improved. Regarding the light emitting device used in the present invention, a semiconductor light emitting device is preferred having a light emitting layer being able to emit the light emitting wavelength which can make it possible to excite the phosphor substrate effectively. According to the present invention, the emitted light converted in the phosphor substrate can be obtained with the constant wavelength under the condition where the light emitting wavelength region of the light emitting layer is set within the ultraviolet region, even if there are some errors of the light emitting wavelength in the light emitting layer. Furthermore, the emitted light from the phosphor substrate can be mixed with a part of the light emitted from the other phosphor, so that the white light can be emitted.

(Other Phosphor)

The "other phosphor" is selected so as to form the preferred white light source by complementing with a phosphor substrate without limitation such as powder form or substrate. For example, the nitride phosphor can contain (1) N and (2) at least one element of Group II selected from the group consisting of Be, Mg, Ca, Sr, Ba and Zn (which is activated by at least one element of rare earth selected from the group consisting of Y, La, Ce, Pr, Nd, Sm, Eu, Gd, Tb, Dy, Ho, Er and Lu) and (3) at least one element of Group IV selected from the group consisting of C, Si, Ge, Sn, Ti, Zr and Hf.

(Selective Crystallization)

The term "selective crystallization on the seed" means a step of allowing the crystallization to take place on the surface of the seed, accompanied by substantially no spontaneous growth. This selective crystallization on the seed is essential for the growth of a bulk single crystal, and it is one of the elements of the present invention.

(Feedstock)

Pellets to be used in the present invention are prepared by molding the powder and baking them so that their density is 70% or more. Higher density is preferable. The powder once formed can be used. Or it is possible to apply a method comprising the steps of forming the poly crystal of the metallic nitride from metal, dissolving and recrystallizing the same in the crucible placed in the dissolution zone in the supercritical ammonia-containing solution, for example, similarly as the method of forming gallium nitride from metallic gallium.

(Temperature and Pressure of the Reaction)

The temperature distribution in the autoclave as will be described later in the part of Example is determined by using an empty autoclave, i.e. without the supercritical ammonia, and thus, the supercritical temperature is not the one actually measured. On the other hand, the pressure in the autoclave is directly measured, or it is determined by the calculation from the amount of ammonia introduced initially, the temperature and the volume of the autoclave.

Example

High-pressure autoclave 1 (FIGS. 4 and 5), having the inner diameter of 40 mm, length equal to 480 mm (D/L=1/12) and volume of 585 cm$^3$, is charged with 30 g of feedstock in the form of GaN in the crucible in the dissolution zone 13, and GaN seed of the diameter of 1 inchφ obtained by HVPE method is placed in the crystallization zone 14 of the same autoclave. Next the autoclave 1 is filled with 1.2 g of 6N purity metallic gallium and 1.2 g of metallic Zn, and then 7 g of 3N purity metallic lithium (or 23 g of metallic sodium) as a mineralizer, and further 238 g of ammonia (5N) and finally closed. The autoclave 1 is introduced into the furnace unit 4 and heated to 200° C. for three days.

Figure 6:
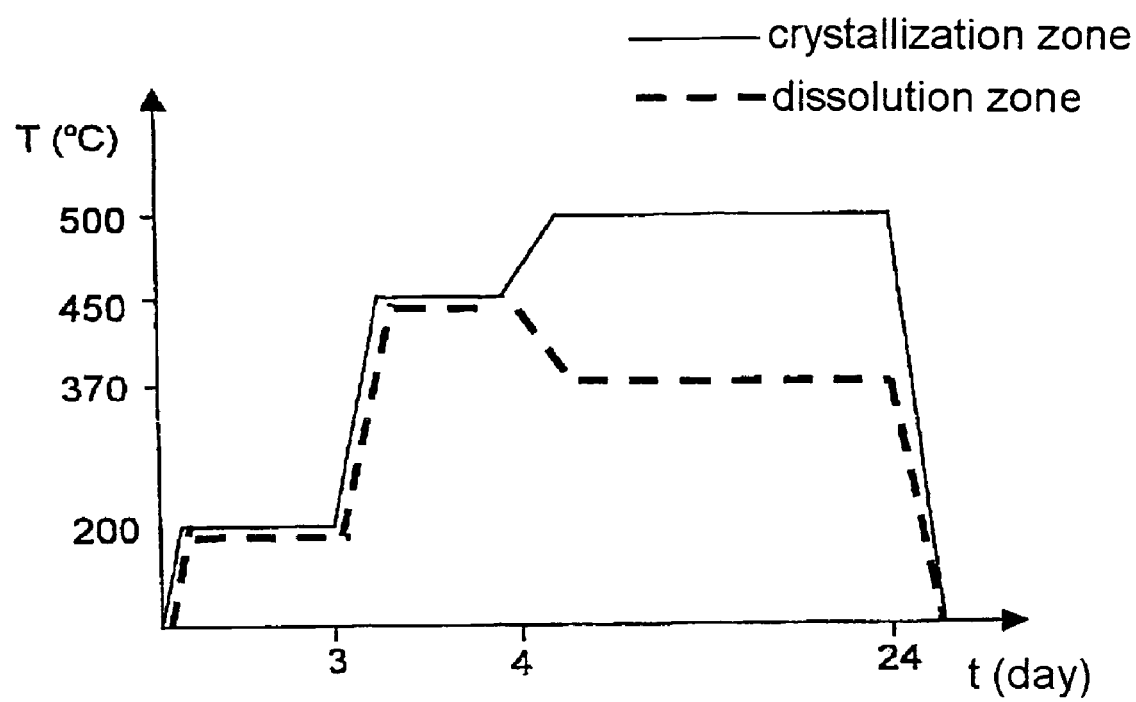
FIG. 6 shows a graph illustrating change in temperature in an autoclave with the passage of time and a relation of change in a dissolution step and a crystallization step in Example.
Figure 7:
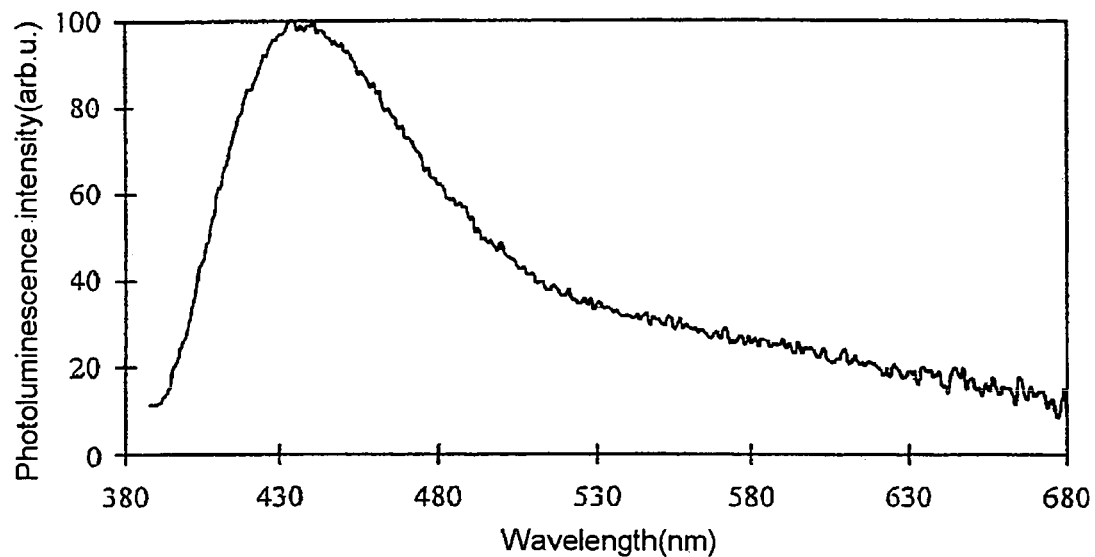
FIG. 7 shows the photoluminescence spectrum of the phosphor prepared by crystallization from supercritical ammonia-containing solution after excitation with UV rays.
Figure 8:
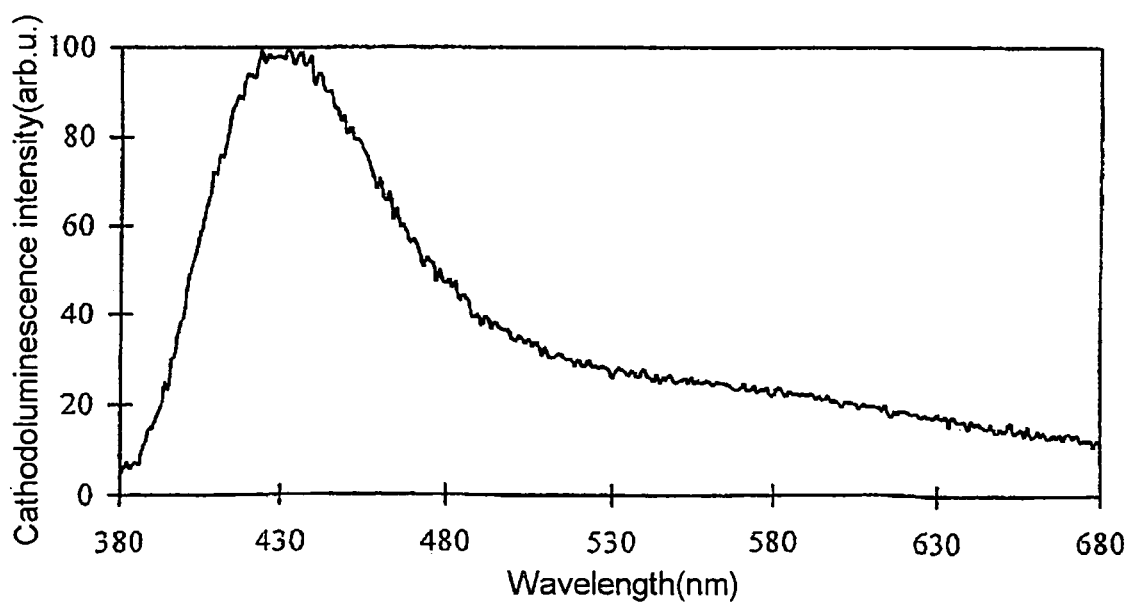
FIG. 8 shows the cathodoluminescence spectrum of the phosphor prepared by crystallization from supercritical ammonia-containing solution after excitation with electron beams.
Figure 9:
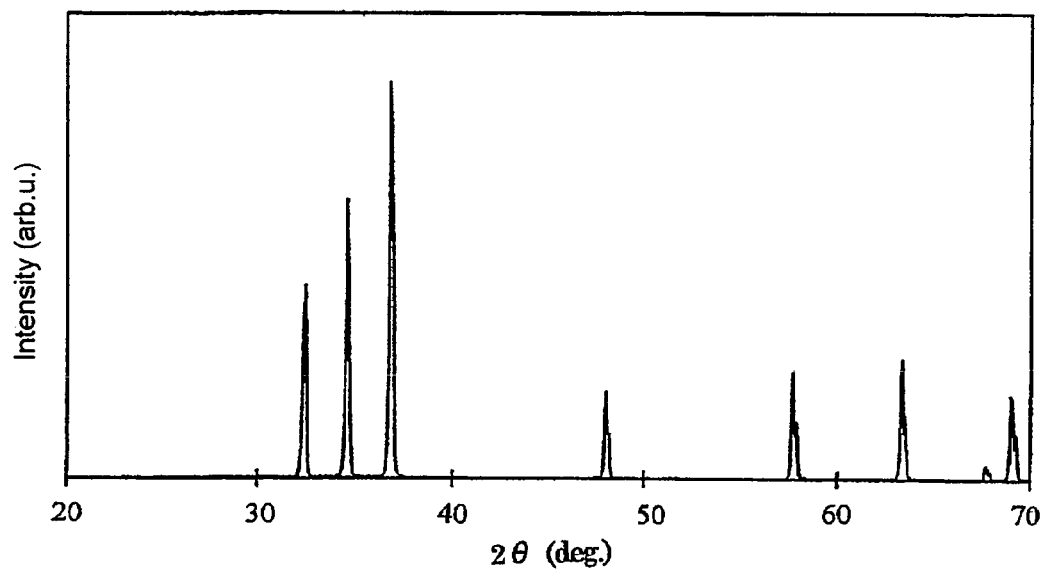
FIG. 9 shows the X-ray diffractogram of the phosphor prepared by crystallization from supercritical ammonia-containing solution.
Figure 10:
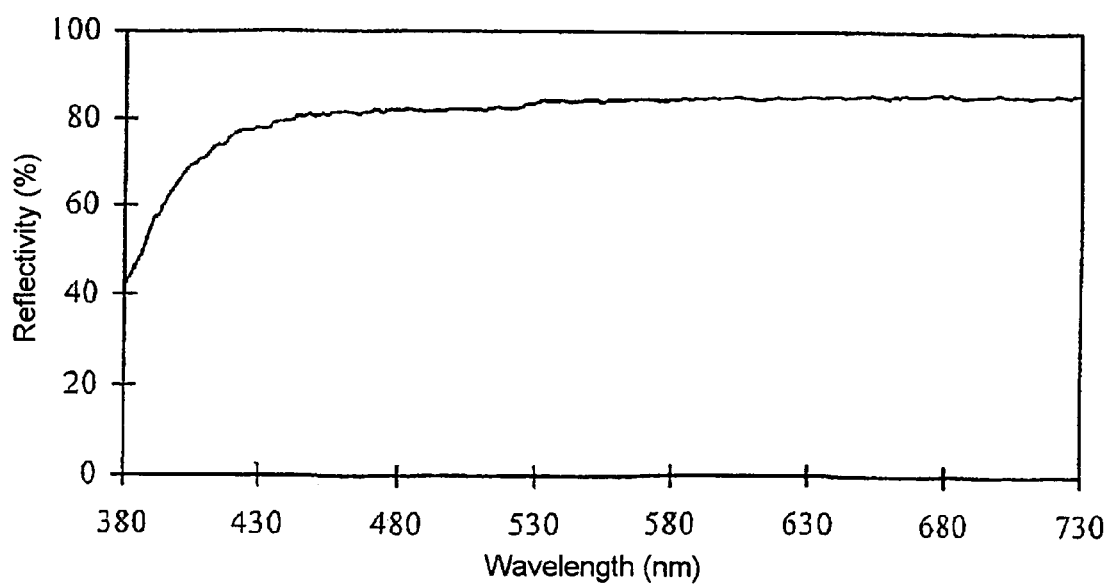
FIG. 10 shows the curve of the spectral reflectance of the phosphor prepared by the supercritical method.

Then the temperature in the dissolution zone 13 of the autoclave is increased to 425° C., while the temperature in the crystallization zone 14 is increased to 525° C. The resultant pressure within the autoclave is 2.5 kbar. The autoclave is left under such condition for another twenty eight days. (FIG. 6) As a result of the processes, partial dissolution of the feedstock in the dissolution zone 13 and growth of GaN:Zn on the HVPE-GaN seed in the crystallization zone 14 are observed.

The processes described below are carried out so as to use the resultant crystal as a substrate.

1) A single crystal deposited on a HVPE-GaN seed is put into a furnace and annealed for 1 to 5 hours in the nitrogen atmosphere, containing low amount of oxygen, at temperature from 600° C. to 900° C.

2) The sample is placed into the wire saw manufactured by Takatori Corp. The sample is positioned with the off-angle about 1 degree or less. Then the sample is sliced by diamond slurry, so that the sample with the off-angle between 0.05 and 0.2 degree is obtained.

3) The sliced samples are put once more into a furnace and annealed again for 1 to 5 hours in the nitrogen atmosphere, containing low amount of oxygen, at temperature from 600° C. to 900° C. (The thus prepared sample is called GaN:Zn phosphor substrate.)

4) The GaN:Zn phosphor substrate is adhered by adhesive agent on the block for polishing, the block is placed on a polishing machine manufactured by Logitech Ltd. and the GaN substrate is polished consecutively on each side. In the polishing process, diamond slurry and colloidal silica with pH from 3 to 6 or alumina solution with pH from 9 to 11 are used. The roughness of the obtained surface is 10 Å or less.

5) Next, a cap layer of less than several μm in the form of GaN or AlGaN is formed on the surface of GaN substrate by HVPE method, under the condition as follows, so that a template is obtained.

HVPE condition: reaction temperature: 1050° C.,
reaction pressure: atmospheric pressure,
partial pressure of ammonia: 0.3 atm,
partial pressure of GaCl: $1 \times 10^{-3}$ atm
hydrogen carrier gas As required, 6) After polishing, the substrate is kept in the supercritical ammonia without mineralizer for 1 day at 200° C. and then the impurity on the surface of the substrate is removed.

The obtained phosphor substrate is illuminated with the UV rays of the wavelength of 365 nm, followed by measuring its luminescence spectrum. The peak of the wavelength is within 400-480 nm.

(7) Then, the LED device of UV rays is deposited on the phosphor substrate 101. The condition of the nitride semiconductor 102 is described below.

An undoped GaN layer of 5 μm, an n-type clad layer of 400 angstroms $Al_{0.18}Ga_{0.82}N$ doped with Si (dopant of Si: $5 \times 10^{17}/cm^3$), and an active layer having total thickness of 420 angstroms comprised with $Al_{0.1}Ga_{0.9}N$ of 200 angstroms doped with $Si/In_{0.03}Al_{0.02}Ga_{0.95}N$ of 70 angstroms/ $Al_{0.1}Ga_{0.9}N$ of 40 angstroms doped with $Si/In_{0.03}Al_{0.02}Ga_{0.95}N$ of 70 angstroms/$Al_{0.1}Ga_{0.9}N$ of 40 angstroms doped with Si. Next, p-type clad layer comprising 600 angstroms $Al_{0.2}Ga_{0.8}N$ doped with Mg, p-type contact layer of 0.1 μm $Al_{0.04}Ga_{0.96}N$ doped with Mg (dopant of Mg:$1 \times 10^{19}/cm^3$), and a layer of 0.02 μm $Al_{0.01}Ga_{0.99}N$ doped with Mg (dopant of Mg: $2 \times 10^{21}/cm^3$) is formed.

Figure 11:
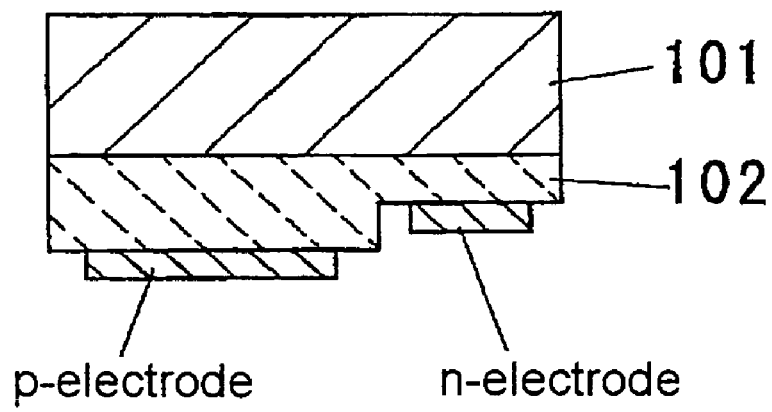
FIG. 11 is a schematic cross-sectional view of the first light emitting device formed on the phosphor substrate according to the present invention.

In the obtained LED device (FIG. 11), an n-type electrode and a p-type electrode are formed on the same side. The LED device performs UV rays light emitting: 373 nm, power output: 4.2 mW and Vf:3.5V in the current forward direction of 20 mA. Moreover, the wavelength is converted by a phosphor substrate so as to obtain the light emitting device with 460 nm. The light emitting device is preferably in the form of flip chip type having the light extraction plane on the side of the phosphor substrate.

According to the present invention, the spectral reflectance of the phosphor is high and the absorption coefficient is low, so that the light can be emitted effectively.

Example 2

Figure 12:
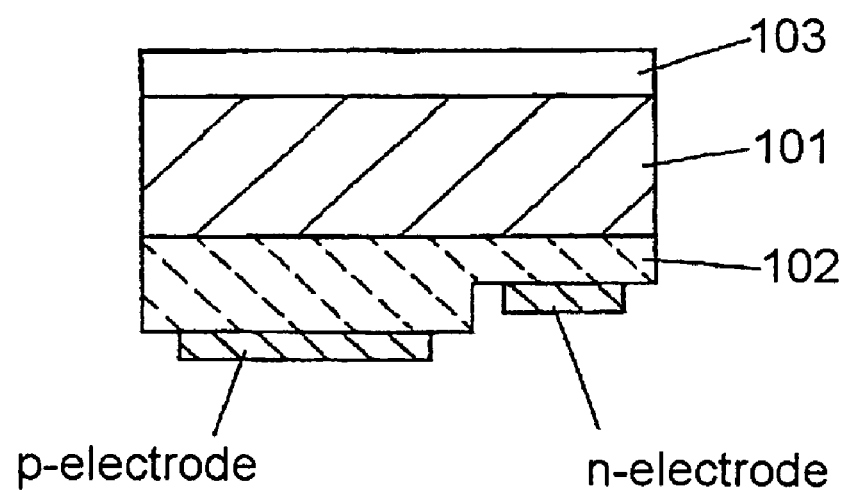
FIG. 12 is a schematic cross-sectional view of the second light emitting device formed on the phosphor substrate according to the present invention.

The light emitting device obtained in Example 1 is made in the form of flip chip type, then the light emitting device having the other phosphor is formed. The other phosphor can be formed by coating the surface of the light extraction plane of the phosphor substrate or by molding the resin mixed with phosphor. According to this Example, light emitting device (101, 102) is made in the form of flip chip type and nitride phosphor layer 103 of $(Ca_{0.97}Eu_{0.03})_2Si_5N_8$ is coated by spray coating or screen print on the surface of the light extraction plane of the phosphor substrate of the light emitting device so as to obtain a white light resource. (FIG. 12)

Example 3

The light emitting device obtained in Example 1 is made in the form of flip chip type using the yttrium-gadolinium-aluminum oxide phosphor activated by Cerium (Y—Gd—Al—O:Ce) as a phosphor coating the surface of the substrate of the light emitting device by spray coaring or screen print so as to obtain a white light resource.

Example 4

In the light emitting device obtained in Example 1, the surface of the substrate of the light emitting device is coated with a nitride phosphor of $Ca_2Si_5N_7$:Eu with addition of B, so as to obtain a white light resource.

Example 5

In the light emitting device obtained in Example 1, the surface of the substrate of the light emitting device is coated with $(Ca_{0.97}Eu_{0.03})_2Si_5N_8$ and yttrium-gadolinium-aluminum oxide phosphor activated by Cerium (Y—Gd—Al—O:Ce) so as to obtain a white light resource.

INDUSTRIAL APPLICABILITY

A high quality nitride phosphor substrate can be manufactured by crystallization from supercritical ammonia-containing solution, so that the light emitting device comprising the substrate can be obtained.

The invention claimed is:

1. A phosphor substrate, comprising a nitride containing at least one element selected from Group XIII (IUPAC 1989) having:
   a general formula XN, wherein X is at least one element selected from B, Al, Ga and In,
   a general formula XN:Y, wherein X is at least one element selected from B, Al, Ga and In, and Y is at least one element selected from Be, Mg, Ca, Sr, Ba, Zn, Cd and Hg, or
   a general formula XN:Y,Z, wherein X is at least one element selected from B, Al, Ga and In, Y is at least one element selected from Be, Mg, Ca, Sr, Ba, Zn, Cd and Hg, and Z is at least one element selected from C, Si, Ge, Sn, Pb, O and S; and
   wherein said phosphor substrate contains alkali metals at a concentration of 0.1 ppm or more.

2. The phosphor substrate according to claim 1, wherein said nitride has said general formula XN:Y, wherein said Y is a dopant having a concentration of $10^{17}$ to $10^{21}$/cm$^3$ or said general formula XN:Y,Z, wherein said Y and said Z are dopants having concentrations of $10^{17}$ to $10^{21}$/cm$^3$.

3. The phosphor substrate according to claim 1, wherein said phosphor substrate has an off-angle between 0.05 and 0.2 degree.

4. The phosphor substrate according to claim 1, wherein the roughness of said phosphor substrate surface is 10 Å or less.

5. The phosphor substrate according to claim 1, wherein said phosphor substrate has a surface dislocation density of $10^6$/cm$^2$ or less.

6. The phosphor substrate according to claim 1, wherein said phosphor substrate has a full width at half maximum of X-ray diffraction from a surface plane of 600 arcsec or less.

7. The phosphor substrate according to claim 1, wherein said phosphor substrate has the crystal structure of a wurtzite.

8. The phosphor substrate according to claim 1, wherein a cap layer in the form of GaN or AlGaN is provided on said phosphor substrate.

9. The phosphor substrate according to claim 1, wherein said phosphor substrate consists of GaN:Zn.

10. The phosphor substrate according to claim 1, wherein said phosphor substrate is a single crystal substrate on which a gallium nitride crystal can be grown in the vapor phase.

11. A light emitting device provided with the phosphor substrate according to claim 1, wherein said light emitting device can excite said phosphor substrate.

12. The light emitting device according to claim 11, wherein the light emitting wavelength region of said light emitting device is set within the ultraviolet region.

13. The light emitting device according to claim 11, wherein at least one phosphor layer is provided on said phosphor substrate.

14. The light emitting device according to claim 13, wherein said phosphor layer comprises the nitride phosphor activated by at least one element of rare earth selected from the group consisting of Y, La, Ce, Pr, Nd, Sm, Eu, Gd, Tb, Dy, Ho, Er and Lu, and contains N and at least one element of Group II selected from the group consisting of Be, Mg, Ca, Sr, Ba and Zn, and at lest one element of Group IV selected from the group consisting of C, Si, Ge, Sn, Ti, Zr and Hf.

15. The light emitting device according to claim 11 or 13, wherein said light emitting device is in the form of flip chip type having the light extraction plane on the side of said phosphor substrate.

16. The light emitting device according to claim 13, wherein said light emitting device is able to emit white light by mixing light emitted from said phosphor substrate and a part of light emitted from said phosphor layer.

17. The phosphor substrate according to claim 1, wherein said phosphor substrate is prepared by crystallization from a supercritical ammonia-containing solution.

18. A phosphor substrate comprising a nitride containing at least one element selected from Group XIII (IUPAC 1989) having:
   a general formula XN, wherein X is at least one element selected from B, Al, Ga and In,
   a general formula XN:Y, wherein X is at least one element selected from B, Al, Ga and In, and Y is at least one element selected from Be, Mg, Ca, Sr, Ba, Zn, Cd and Hg, or
   a general formula XN:Y,Z, wherein X is at least one element selected from B, Al, Ga and In, and Y is at least one element selected from Be, Mg, Ca, Sr, Ba, Zn, Cd and Hg, and Z is at least one element selected from C, Si, Ge, Sn, Pb, O and S; and
   wherein said phosphor substrate has a surface dislocation density of $10^6$/cm$^2$ or less and a full width at half maximum of X-ray diffraction from a surface plane of 300 arcsec or less, and contains alkali metals at a concentration of 0.1 ppm or more.

* * * * *

UNITED STATES PATENT AND TRADEMARK OFFICE
CERTIFICATE OF CORRECTION

PATENT NO. : 7,589,358 B2  Page 1 of 1
APPLICATION NO. : 10/514429
DATED : September 15, 2009
INVENTOR(S) : Robert Dwilinski et al.

It is certified that error appears in the above-identified patent and that said Letters Patent is hereby corrected as shown below:

On the front page, the Title (54) & Col. 1 should read as follows:

PHOSPHOR SINGLE CRYSTAL SUBSTRATE AND METHOD FOR PREPARING THE SAME, AND NITRIDE SEMICONDUCTOR DEVICE USING THE SAME

Signed and Sealed this

Twenty-fourth Day of November, 2009

David J. Kappos
*Director of the United States Patent and Trademark Office*